United States Patent
Clark et al.

(10) Patent No.: US 10,439,112 B2
(45) Date of Patent: Oct. 8, 2019

(54) LIGHT EMITTER PACKAGES, SYSTEMS, AND METHODS HAVING IMPROVED PERFORMANCE

(75) Inventors: Joseph G. Clark, Raleigh, NC (US); Jeffrey Carl Britt, Cary, NC (US); Amber C. Abare, Durham, NC (US); Raymond Rosado, Apex, NC (US); Harsh Sundani, Raleigh, NC (US); David T. Emerson, Chapel Hill, NC (US); Jeremy Scott Nevins, Cary, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 13/554,776

(22) Filed: Jul. 20, 2012

(65) Prior Publication Data

US 2013/0322068 A1  Dec. 5, 2013

Related U.S. Application Data

(63) Continuation of application No. 29/423,422, filed on May 31, 2012, now Pat. No. Des. 709,464.
(Continued)

(51) Int. Cl.
| | |
|---|---|
| *H01L 33/58* | (2010.01) |
| *F21V 21/00* | (2006.01) |
| *F21V 7/00* | (2006.01) |
| *H01L 33/48* | (2010.01) |
| *H01L 33/62* | (2010.01) |
| *H01L 33/64* | (2010.01) |

(Continued)

(52) U.S. Cl.
CPC ............ *H01L 33/58* (2013.01); *F21V 7/00* (2013.01); *F21V 21/00* (2013.01); *H01L 33/48* (2013.01); *H01L 33/62* (2013.01); *H01L 33/641* (2013.01); *F21K 9/233* (2016.08); *F21V 29/74* (2015.01); *F21Y 2105/10* (2016.08); *F21Y 2115/10* (2016.08); *H01L 33/486* (2013.01); *H01L 2224/48091* (2013.01)

(58) Field of Classification Search
CPC .......................... H01L 33/507; H01L 33/508
USPC ............................................. 257/88, 92, 99
See application file for complete search history.

(56) References Cited

U.S. PATENT DOCUMENTS

| | | |
|---|---|---|
| 4,948,547 A | 8/1990 | Palmour |
| 5,200,022 A | 4/1993 | Kong |

(Continued)

FOREIGN PATENT DOCUMENTS

| | | |
|---|---|---|
| CN | 1860620 | 11/2006 |
| CN | 101127350 | 2/2008 |

(Continued)

OTHER PUBLICATIONS

English Translation of DE 10 2007 029 369 A1.*
(Continued)

*Primary Examiner* — Stephen M Bradley
(74) *Attorney, Agent, or Firm* — Jenkins, Wilson, Taylor & Hunt, P.A.

(57) ABSTRACT

Light emitter packages, systems, and methods having improved performance are disclosed. In one aspect, a light emitter package can include a submount that can include an anode and a cathode. A light emitter chip can be disposed over the submount such that the light emitter chip is mounted over at least a portion of the cathode and wire-bonded to at least a portion of the anode.

37 Claims, 8 Drawing Sheets

Related U.S. Application Data

(60) Provisional application No. 61/653,809, filed on May 31, 2012, provisional application No. 61/665,057, filed on Jun. 27, 2012, provisional application No. 61/669,738, filed on Jul. 10, 2012.

(51) Int. Cl.
  *F21V 29/74* (2015.01)
  *F21Y 105/10* (2016.01)
  *F21K 9/233* (2016.01)
  *F21Y 115/10* (2016.01)

(56) References Cited

U.S. PATENT DOCUMENTS

| | | | |
|---|---|---|---|
| RE34,861 E | 2/1995 | Davis | |
| 7,213,940 B1 | 5/2007 | Van De Ven | |
| D615,504 S | 5/2010 | Keller et al. | |
| 7,791,061 B2 | 9/2010 | Edmond | |
| D628,966 S | 12/2010 | Kuwaharada et al. | |
| D631,020 S | 1/2011 | Chuang et al. | |
| 8,058,088 B2 | 11/2011 | Cannon | |
| D650,343 S | 12/2011 | Andrews et al. | |
| D658,139 S | 4/2012 | Andrews et al. | |
| D660,257 S | 5/2012 | Andrews et al. | |
| D674,758 S | 1/2013 | Wu et al. | |
| D675,169 S | 1/2013 | Chou | |
| 8,367,945 B2 | 2/2013 | Cheng et al. | |
| 8,400,064 B2 | 3/2013 | Wei et al. | |
| 8,575,734 B2 * | 11/2013 | Shin | 257/668 |
| 8,610,145 B2 * | 12/2013 | Yano | 257/98 |
| 8,685,766 B2 * | 4/2014 | Suehiro | H01L 33/56 257/E21.504 |
| 8,736,197 B2 | 5/2014 | Datta et al. | |
| D709,464 S | 7/2014 | Abare et al. | |
| D711,841 S | 8/2014 | Britt et al. | |
| D713,804 S | 9/2014 | Britt et al. | |
| D749,051 S | 2/2016 | Clark et al. | |
| 9,337,398 B2 * | 5/2016 | Basin | C09K 11/02 |
| 9,349,929 B2 | 5/2016 | Clark et al. | |
| 2003/0080341 A1 * | 5/2003 | Sakano | B29C 67/08 257/79 |
| 2004/0069999 A1 * | 4/2004 | Lin | H01L 33/486 257/88 |
| 2004/0262738 A1 | 12/2004 | Lee et al. | |
| 2006/0226758 A1 * | 10/2006 | Sofue | C09D 183/04 313/483 |
| 2007/0158668 A1 | 7/2007 | Tarsa | |
| 2008/0001160 A1 | 1/2008 | Andrews | |
| 2008/0026498 A1 | 1/2008 | Tarsa et al. | |
| 2008/0035947 A1 * | 2/2008 | Weaver, Jr. et al. | 257/99 |
| 2008/0041625 A1 | 2/2008 | Cheong et al. | |
| 2008/0054286 A1 | 3/2008 | Loh et al. | |
| 2008/0074029 A1 * | 3/2008 | Suehiro | 313/487 |
| 2008/0173884 A1 | 7/2008 | Chitnis | |
| 2008/0179611 A1 | 7/2008 | Chitnis | |
| 2008/0258130 A1 | 10/2008 | Bergmann | |
| 2008/0290352 A1 * | 11/2008 | Park | 257/89 |
| 2009/0050907 A1 | 2/2009 | Yuan et al. | |
| 2009/0108281 A1 * | 4/2009 | Keller | H01L 33/62 257/98 |
| 2009/0146159 A1 * | 6/2009 | Park et al. | 257/93 |
| 2009/0179207 A1 * | 7/2009 | Chitnis | H01L 33/44 257/88 |
| 2010/0140634 A1 | 6/2010 | Van De Ven et al. | |
| 2010/0155748 A1 * | 6/2010 | Chan et al. | 257/89 |
| 2010/0155763 A1 | 6/2010 | Donofrio | |
| 2010/0187546 A1 * | 7/2010 | Fushimi | H01L 33/62 257/88 |
| 2010/0207534 A1 | 8/2010 | Dowling et al. | |
| 2010/0237377 A1 | 9/2010 | Park | |
| 2010/0237775 A1 | 9/2010 | Chao | |
| 2010/0252851 A1 * | 10/2010 | Emerson et al. | 257/98 |
| 2010/0277919 A1 | 11/2010 | Okada et al. | |
| 2010/0289044 A1 | 11/2010 | Krames et al. | |
| 2011/0012143 A1 | 1/2011 | Yuan et al. | |
| 2011/0062482 A1 | 3/2011 | Solomensky et al. | |
| 2011/0116252 A1 | 5/2011 | Agatani et al. | |
| 2011/0127912 A1 | 6/2011 | Lee et al. | |
| 2011/0220920 A1 | 9/2011 | Collins et al. | |
| 2011/0220926 A1 * | 9/2011 | Kim | 257/91 |
| 2012/0069564 A1 | 3/2012 | Andrews et al. | |
| 2012/0086024 A1 | 4/2012 | Andrews et al. | |
| 2012/0199852 A1 | 8/2012 | Lowes et al. | |
| 2012/0286304 A1 | 11/2012 | LeToquin et al. | |
| 2012/0305949 A1 | 12/2012 | Donofrio | |
| 2012/0326159 A1 | 12/2012 | Bergmann | |
| 2013/0092960 A1 | 4/2013 | Wilcox et al. | |
| 2013/0105835 A1 | 5/2013 | Wu et al. | |
| 2013/0322070 A1 | 12/2013 | Clark et al. | |

FOREIGN PATENT DOCUMENTS

| | | |
|---|---|---|
| CN | 102130112 | 7/2011 |
| CN | 102132424 | 7/2011 |
| CN | 102136200 | 7/2011 |
| CN | 102149960 | 8/2011 |
| CN | 102484190 | 5/2012 |
| CN | 102484920 A | 5/2012 |
| CN | ZL201230586339.6 | 7/2013 |
| CN | 302758425 S | 3/2014 |
| CN | ZL201330525210.9 | 6/2014 |
| CN | ZL201330525357.8 | 6/2014 |
| CN | ZL201330525231.0 | 7/2014 |
| CN | 104396036 B | 5/2018 |
| DE | 102007029369 A1 * | 1/2009 |
| EP | 1 393 385 A1 | 3/2004 |
| EP | 2856524 | 4/2015 |
| EP | 2856525 | 4/2015 |
| JP | 2002-057374 | 2/2002 |
| JP | 2003-258310 | 9/2003 |
| JP | 2008-034513 | 2/2008 |
| TW | 201036200 | 10/2010 |
| WO | WO 2009/067991 A2 | 6/2009 |
| WO | WO 2011088730 | 7/2011 |
| WO | WO 2012/040085 A1 | 3/2012 |
| WO | WO 2013/181537 | 12/2013 |
| WO | WO 2013/181538 | 12/2013 |

OTHER PUBLICATIONS

Elenius et al. (Comparing Flip-Chip and Wire-Bond interconnection Technologies. Chip Scale Review, Jul./Aug. 2000 pp. 81-87).*
Chinese Office Action for Application No. 201330525231.0 dated Jan. 13, 2014.
Notice of Allowance for U.S. Appl. No. 29/423,422 dated Mar. 3, 2014.
Chinese Notice of Issuance for Application No. 201330525357.8 dated Feb. 19, 2014.
Chinese Office Action for Application No. 201330248426.5 dated Aug. 19, 2013.
International Search Report and Written Opinion for Application No. PCT/US2013/043618 dated Sep. 25, 2013.
International Search Report and Written Opinion for Application No. PCT/US2013/043619 dated Sep. 26, 2013.
Restriction Requirement for U.S. Appl. No. 29/423,422 dated Sep. 30, 2013.
Restriction Requirement for U.S. Appl. No. 29/439,629 dated Sep. 30, 2013.
Notice of Issuance for Application No. 201330248426.5 dated Nov. 19, 2013.
Notice of Allowance for U.S. Appl. No. 29/423,422 dated Nov. 19, 2013.
Notice of Allowance for U.S. Appl. No. 29/439,629 dated Nov. 27, 2013.
Notice of Allowance for U.S. Appl. No. 29/439,629 dated May 28, 2014.
U.S. Appl. No. 29/491,974, filed May 27, 2014.
Supplemental Notice of Allowability for U.S. Appl. No. 29/439,629 dated Sep. 4, 2014.

(56) References Cited

OTHER PUBLICATIONS

Notice of Allowance for U.S. Appl. No. 29/439,629 dated Oct. 7, 2014.
Restriction Requirement for U.S. Appl. No. 13/713,410 dated Oct. 6, 2014.
Chinese Notice of Issuance for Application No. 201330525210.9 dated Feb. 19, 2014.
Notice of Allowance for U.S. Appl. No. 29/439,629 dated Feb. 19, 2014.
Chinese Notice of Allowance for Application No. 201330525231.0 dated Apr. 10, 2014.
Notice of Allowance for U.S. Appl. No. 29/439,629 dated Jan. 16, 2015.
Restriction Requirement for U.S. Appl. No. 13/713,410 dated Feb. 26, 2015.
Notice of Allowance for U.S. Appl. No. 29/439,629 dated May 22, 2015.
Non-Final Office Action for U.S. Appl. No. 13/713,410 dated Jul. 6, 2015.
Notice of Allowance for U.S. Appl. No. 29/491,974 dated Aug. 4, 2015.
Notice of Allowance for U.S. Appl. No. 29/439,629 dated Sep. 10, 2015.
Supplementary European Search Report for Application No. EP 13 79 7813 dated Nov. 27, 2015.
Supplementary European Search Report for Application No. EP 13 79 6844 dated Nov. 27, 2015.
Corrected Notice of Allowability for U.S. Appl. No. 29/439,629 dated Jan. 4, 2016.
Notice of Allowance for U.S. Appl. No. 13/713,410 dated Jan. 15, 2016.
Chinese Office Action for Application No. 2013800290652 dated Jun. 21, 2016.
Chinese Office Action for Application No. 201380029004 dated Aug. 4, 2016.
Chinese Office Action for Application No. 201380029065.2 dated Mar. 15, 2017.
Chinese Office Action for Application No. 201380029004 dated Apr. 5, 2017.
Chinese Office Action for Chinese Application No. 201380029004.6 dated Oct. 10, 2017.
Chinese Office Action for Application No. 201380029065.2 dated Oct. 11, 2017.
Chinese decision of Rejection for Chinese Application No. 201380029004.6 dated Apr. 18, 2018.
Chinese Office Action for Application No. 201380029004.6 dated Jan. 15, 2019.
Chinese Notice of Grant for Application No. 201230586339.6 dated Apr. 15, 2013.
"High Flux Density and Efficacy," Luxeon M Datasheet DS103, 2012, pp. 1-22, Philips Lumileds Company, United States.
Shchekin, Oleg et al., "Evolutionary new chip design targets lighting systems," Compound Semiconductor, Mar. 2007, vol. 13 No. 2, Institute of Physics Publishing and IOP Publishing Ltd.
Chinese Office Action for Application No. 201380029004.6 dated Jun. 20, 2019.

* cited by examiner

LIGHT EMITTER PACKAGES, SYSTEMS, AND METHODS HAVING IMPROVED PERFORMANCE

CROSS REFERENCE TO RELATED APPLICATIONS

This application is a continuation of and claims priority to U.S. Design patent application 29/423,422, filed May 31, 2012, and further relates to and claims priority to U.S. Provisional Patent Application Ser. Nos. 61/653,809, filed May 31, 2012, 61/665,057, filed Jun. 27, 2012, and 61/669,738 filed Jul. 10, 2012, the disclosures of each of which are incorporated herein by reference in their entireties.

TECHNICAL FIELD

The subject matter disclosed herein relates generally to light emitter packages, systems, and methods. More particularly, the subject matter disclosed herein relates to light emitting diode (LED) packages, systems, and methods having improved performance at a lower cost.

BACKGROUND

Light emitting diodes (LEDs) or LED chips are solid state devices that convert electrical energy into light. LED chips can be utilized in light emitter packages for providing different colors and patterns of light useful in various lighting and optoelectronic applications. For example, light emitter packages can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers, and encourage the adoption of LED products. Brighter, more efficient LED chips and/or packages can allow lighting manufacturers to use fewer LED chips to get the same brightness at a lower cost or increase brightness levels using the same LED chip count and power. Such improvements can enable delivery of improved light emitter packages and/or systems for less total cost than other solutions.

Thus, despite the availability of various light emitter packages in the marketplace, a need remains for brighter, more cost-effective light emitter packages, systems, and/or methods which consume the same and/or less power as compared to conventional packages and/or systems. Such packages, systems, and methods can also make it easier for end-users to justify switching to LED products from a return on investment or payback perspective.

SUMMARY

In accordance with this disclosure, light emitter packages, systems, and methods having improved performance are provided and described herein. For example, packages, systems, and methods described herein can advantageously exhibit improved brightness, binning accuracy, light extraction, and/or ease of manufacture at a lower overall cost. In one aspect, packages, systems, and methods described herein offer cost-effective lighting solutions well suited for a variety of applications such as personal, industrial, and commercial lighting products and applications including, for example, indoor lighting, LED light bulbs, accent and track lighting, directional, low bay, high bay, roadway, parking, portable lighting, bicycle lighting, solar-powered lighting, battery-powered lighting, and high end lighting fixtures, products and/or applications. It is, therefore, an object of the present disclosure to provide light emitter packages, systems, and methods having improved performance, in one aspect, by utilizing metallic plating and/or optical conversion material disposed below portions of an optical element or lens, in addition to incorporating a novel LED chip and/or novel solder mask placement.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
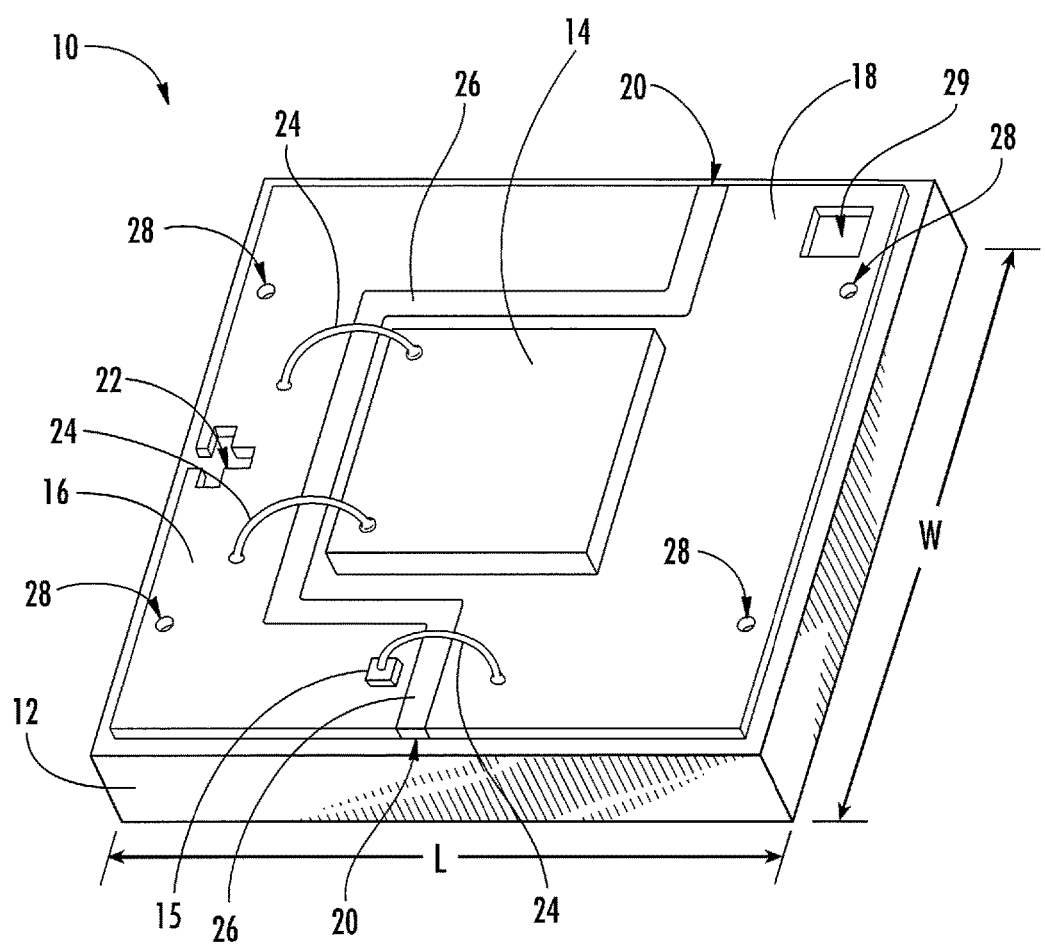
FIG. 1 is a top perspective view of a portion of a light emitter package according to one aspect of the disclosure herein.

The subject matter disclosed herein is directed to packages, systems, and methods for use with light emitters, such as light emitting diodes (LEDs). Packages, systems, and methods described herein exhibit improved performance, for example, improved efficiency, brightness, and/or light extraction at a lower cost than conventional package and/or systems. Packages and systems described herein can utilize one or more novel LED chips either alone and/or in combination with other novel features such as placement or configuration of exposed metallic traces, optical conversion material, and/or solder mask material.

Packages and systems described herein can exhibit improved light output, reliability, and efficacy by delivering up to and/or more than approximately 133 lumens per watt (LPW) at 350 milliamps (mA) and approximately 85° C. in selected color temperatures. For example, packages and systems described herein can deliver up to and/or approximately more than 145 LPW at 350 mA and approximately 25° C. in selected color temperatures. In further aspects, packages and systems described herein can deliver up to and/or more than approximately 151 LPW at 350 mA and approximately 85° C. in selected color temperatures. In further aspects, packages and systems described herein can deliver up to and/or more than approximately 165 LPW or more at 350 mA and approximately 25° C. in selected color temperatures. Notably, packages and systems described herein can in one aspect deliver approximately 200 LPW or more at 350 mA and approximately 25° C. in selected color temperatures. Selected color temperatures can comprise cool white (CW) color temperatures of around 6000K or warm white (WW) color temperatures of around 3000K. Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the package or component in addition to the orientation depicted in the figures. For example, if the package or component in the figures is turned over, structure or portion described as "above" other structures or portions would now be oriented "below" the other structures or portions. Likewise, if the package or component in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

Light emitter packages according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. Nos. Re. 34,861; 4,946,547; and 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips, and notably, portions of light emitter packages described herein such as the ceramic based submount, lens, and/or traces can be at least partially coated with one or more phosphors. The phosphors can absorb a portion of light from the LED chip and emit a different wavelength of light such that the light emitter package emits a combination of light from each of the LED chip and the phosphor. In one embodiment, the light emitter package emits what is perceived as white light resulting from a combination of light emission from the LED chip and the phosphor. In one embodiment according to the present subject matter, a white emitting package can consist of an LED chip that emits light in the blue wavelength spectrum and a phosphor that absorbs some of the blue light and re-emits light in the yellow wavelength spectrum. The package can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter packages and methods according to the present subject matter can also have multiple LED chips of different colors, one or more of which can be white emitting.

FIGS. 1 to 8B are embodiment of packages and systems for use with light emitters, such as LED chips. Light emitter packages and systems described herein can advantageously be configured for improved performance, such as improved brightness, by delivering more LPW at an improved, lower cost than conventional packages and systems. In general, light emitter packages and/or systems described herein can be sorted or binned both at "hot" temperatures (approximately 85° C.) or "cold" temperatures (e.g., approximately 25° C.). Packages and/or systems can be sorted or binned into groups or ranges based upon color temperature, wavelength, and/or brightness. In some aspects, binning at temperatures of approximately 85° C., or binning at temperatures between approximately 60 and 85° C. may be preferred, as performance at such temperatures can be more indicative of in situ performance of the emitter package or system. Improved performance and/or novel aspects of improved light emitter packages, systems, and methods are discussed hereinbelow. Notably, novel light emitter packages disclosed herein can deliver approximately 200 LPW at 350 mA at an improved, low cost using, for example, at least one LED chip, exposed metal traces, reflective solder mask material disposed in a gap between traces, and a large lens. In some aspects, emitter packages consisting of a single LED chip can deliver approximately 200 LPW at 350 mA.

FIG. 1 illustrates a light emitter package generally designated 10. Light emitter package 10 can comprise a substrate or submount 12 and at least one LED chip 14 disposed over submount 12. Submount 12 can comprise any suitable material, for example, an electrical insulating (e.g. non-electrically conductive) material with a low thermal resistance and/or high thermal conductivity. In one aspect, submount 12 can comprise a non-metallic material, such as a ceramic or ceramic based material. For example, submount 12 can comprise aluminum oxide or alumina ($Al_2O_3$) and derivatives thereof, aluminum nitride (AlN) and derivatives thereof, silicon carbide (SiC) and derivatives thereof, zirconium dioxide or zirconia ($ZrO_2$) and derivatives thereof, titanium dioxide ($TiO_2$) and derivatives thereof, combinations thereof, and/or any other ceramic based or ceramic containing material. In one aspect, AlN may be preferred as it can advantageously comprise a low thermal resistance. Material(s) having a low thermal resistance can be advantageous when provided as submount 12, as heat can more readily dissipate from LED chip 14 and allow light emitter package 10 to run cooler at steady state, thereby increasing lumen output.

Submount 12 can comprise a material having a thermal conductivity of approximately 30 watts per meter kelvin (W/m·K) or more (e.g., zinc oxide (ZnO)). Other acceptable materials have thermal conductivities of approximately 120 W/m·K or more, (e.g., AlN which has a thermal conductivity that can range from approximately 140 to approximately 180 W/m·K). In terms of thermal resistance, some acceptable materials have a thermal resistance of approximately 2° C./W or lower. Other materials may also be used that have thermal characteristics outside the ranges discussed herein.

One or more areas or portions of electrically conductive material can be disposed over one or more portions of submount 12. For example, a first electrically conductive trace 16 and a second electrically conductive trace 18 can be provided and disposed over submount 12. First and second traces 16 and 18, respectively, can be physically and/or electrically separated by a gap generally designated 20. In one aspect LED chip 14 can be entirely disposed over a portion of second electrical trace 18 without traversing and/or being disposed over any portion of gap 20. That is, LED chip 14 can be electrically connected to first trace 16 via wirebond 24. First and second traces 16 and 18, respectively, can be provided over submount 12 via chemical deposition, physical deposition, chemical vapor deposition, plasma deposition, electrolysis, electroplating and/or electroless plating techniques. In one aspect, any suitable processing technique can be used for coating non-metallic parts (e.g., submount 12) with electrically conductive material. Electroplated, electrolytic (e.g., deposition via an electrolysis process), and/or electroless plated first and second traces 16 and 18, respectively, may be preferred as such techniques can advantageously produce traces having more uniform thicknesses as compared to other methods. Any method of layering, coating, and/or depositing conductive material over submount 12 for providing first and second traces 16 and 18 is contemplated.

One or more electrostatic discharge (ESD) protection devices 15 can optionally be disposed within package 10 and can be electrically connected to first and second 16 and 18 and reverse biased with respect to LED chip 14. In one aspect, ESD device 15 can be entirely disposed over first electrical trace 16 and not traverse a portion of gap 20. Where used, ESD device 15 can protect against damage from ESD within package 10. For example, the arrangement of LED chip 14 and ESD device 15 can allow excessive voltage and/or current passing through package 10 from an ESD event to pass into and/or through ESD device 25 instead of LED chip 14, thereby protecting LED chip 14 from damage. ESD device 15 can comprise any suitable body or member configured to protect package 10 from an ESD event. For example, ESD device 15 can comprise a vertical silicon (Si) Zener diode, a differently dimensioned and/or smaller LED chip arranged reverse biased to LED chip 14, a surface mount varistor, and/or a lateral Si diode. As illustrated, ESD device 15 can comprise a vertically structured device having one electrical contact on the bottom and another electrical contact on the top; however, a horizontally structured ESD device 15 is also contemplated.

First and second traces 16 and 18 can comprise at least one layer of exposed metal, which can optionally be covered with an optical conversion material (e.g., 46, FIG. 4B) such as one or more phosphors, lumiphors, and/or binders. In one aspect, first and second traces 16 and 18 comprised of exposed metal can advantageously reflect more light than submount 12, which can improve brightness, light extraction, and performance from light emitter package 10. Notably, leaving metallic traces exposed (e.g., uncovered, such as without a solder mask or other masking material) can also decrease processing steps and/or materials consumed during manufacture, which results in a lower cost.

First and second traces 16 and 18, respectively, can comprise any electrically and/or thermally conductive material or materials and can comprise the same and/or different materials. In one aspect, first and second traces 16 and 18, respectively, can comprise at least one layer of copper (Cu). First and second traces 16 and 18, respectively, can further and optionally comprise one or more layers of silver (Ag) and/or one or more layers of titanium (Ti). For example, first and second traces 16 and 18 can comprise at least one layer of Cu and at least one layer of Ag, at least one layer of Cu and at least one layer of Ti, and/or at least one layer each of Cu, Ag, and Ti. In other aspects, one or more optional layers of electroless nickel immersion gold (ENIG) can also be applied for improving the wirebondability of LED chip 14 to the Cu layer.

In one aspect, first and second traces 16 and 18 can comprise a Cu layer, either directly or indirectly disposed over submount 12. The Cu layer can comprise a thickness ranging from approximately 50 µm to approximately 100 µm, and/or any sub-range therebetween, such as approximately 50 to 55 µm; 55 to 65 µm; approximately 65 to 75 µm; approximately 75 to 85 µm; and/or approximately 85 to 100 µm. In one aspect, the Cu layer can comprise an overall average thickness of approximately 70 µm. First and second traces 16 and 18, respectively, can further comprise an optional, initial layer of Ti that can be deposited directly over submount 12 prior to deposition of the Cu layer. Where used, the Ti layer can comprise a thickness ranging from approximately 0.01 to 1 µm, and/or any sub-range or thickness therebetween, such as approximately 0.01 to 0.05 µm; 0.05 to 0.1 µm; and/or 0.1 to 1 µm. In one aspect, the Ti layer can comprise a thickness or overall thickness of approximately 0.1 µm. First and second traces 16 and 18, respectively, can further comprise an optional layer of Ag that can be deposited, or otherwise formed, directly over the Cu layer such that the Cu layer is disposed between the Ti and Ag layers. Where used, the Ag layer can comprise a thickness from approximately 0.1 to 1 µm, and/or any sub-range therebetween, such as approximately 0.1 to 0.2 µm; 0.2 to 0.5 µm; 0.5 to 0.8; and/or 0.8 to 1 µm.

In one aspect, first and second electrical traces 16 and 18, respectively, can comprise an anode and cathode pair configured to pass electrical current or signal into LED chip 14. For example, electrical current can be conducted through and/or within submount 12 from an outside electrical power source (not shown) into one or more electrical contacts (e.g., 38, 40, FIG. 3) and respective traces 16 and 18 by electrically conductive "through-holes" or "vias" which provide a conduit for electrical current within light emitter package 10. The electrical current can then flow or pass between first and second traces 16 and 18 and into LED chip 14 thereby causing illumination of LED chip 14. Electrical current can then exit light emitter package via at least one electrical contact (e.g., 38 or 40, FIG. 3). In one aspect, first electrical trace 16 can comprise an anode as denoted by the "+" shaped indicator symbol or sign 22 and second electrical trace 18 can comprise a cathode. Notably, LED chip 14 can comprise a novel chip structure and electrical configuration, such that LED chip 14 can electrically connect with a portion of the anode (e.g., first electrical trace 16) via one or more wirebonds 24 and LED chip 14 can be mounted to a portion of the cathode (e.g., second electrical trace 18).

Provision of at least one LED chip 14 wirebonded to a portion of the anode and mounted to a portion of the cathode is unexpected in view of conventional wisdom, and in fact, is the opposite electrical configuration from conventional LED chips (e.g., conventional chips are typically mounted over the cathode and wirebonded to the anode). In one aspect, appropriate LED chips 14 are available from Cree, Inc., of Durham, N.C., the assignee of the present subject matter, the LED chip structures, features, and associated methods of which are set forth in, for example, U.S. patent application Ser. No. 13/168,689, filed Jun. 24, 2011, and entitled "LED Structure With Enhanced Mirror Reflectivity", the entire disclosure of which is incorporated herein by reference.

One novel feature of LED chip 14 (e.g., mounting to cathode and wirebonding to anode), when combined with exposed or uncovered metallic traces, optical conversion material placement, and/or solder mask placement, has been shown to improve package 10 brightness and efficiency. For example, LED chip 14 can comprise alternating p-GaN and n-GaN layers which, in part, advantageously allow for one or more smaller barrier layers to be provided adjacent one or more highly reflective mirrors. In one aspect, the one or more barrier layers can be smaller in width than the mirror layers. Notably, this can advantageously allow for increased light extraction and/or brightness per LED chip 14, as decreasing the size of the barrier layer(s) can allow for barrier layer(s) that is/are minimally exposed and/or not exposed, thereby reducing the dimming effects of the barrier layer(s). Thus, packages 10 comprised of single LED chips 14 can be configured to deliver more LPW per package, for example, up to and/or equal to approximately 200 LPW or more at 350 mA and 25° C.

Wirebonds 24 can comprise any electrically conductive material, such as, for example and without limitation, gold (Au) or an alloy containing Au. LED chip 14 can be mounted, either directly or indirectly, over a portion of the cathode, for example, a portion of second electrical trace 18 via a silicone material or epoxy, a metal epoxy (e.g., Ag epoxy), a solder, solder paste (e.g., AuSn or SnAg solder paste), a flux material, a eutectic material, combinations thereof, and/or any other suitable adhesive material.

Still referring to FIG. 1, light emitter package 10 can further comprise at least one gap 20 disposed between the anode and cathode, such as between first and second traces 16 and 18, respectively. Gap 20 can physically and electrically separate first and second traces 16 and 18, respectively. Gap 20 can be formed using any suitable technique. In one aspect, gap 20 can be at least partially etched after deposition or application of material forming first and second traces 16 and 18. That is, first and second traces 16 and 18 can initially comprise a uniform area or portion of conductive material comprised of one or more layers of metallic material. The layers of metallic material can subsequently become at least partially etched, thereby separating first trace 16 from second trace 18 via gap 20. In further aspects, gap 20 can comprise an area of submount 12 that was masked with photoresist prior to sputtering conductive material over submount 12 to provide first and second traces 16 and 18.

Notably, a reflective member or material can be positioned or configured to fill the space within gap 20, such that the material is disposed between first and second traces 16 and 18, respectively. In one aspect, a mask material, such as a solder mask 26 can be disposed within gap 20. Solder mask 26 can comprise a white or silver-white liquid curable solder mask. Solder mask 26 can advantageously fill gap 20 thereby reducing the amount of light that becomes trapped and/or absorbed by gap 20, which can improve the brightness and overall optical performance of emitter package 10. In one aspect, solder mask 26 can be applied only within gap 20 and not over portions of traces 16 and/18, such that the amount of solder mask material used per package can be reduced, which can advantageously lower the cost of light emitter package 10.

As noted above, first and second traces 16 and 18 can comprise an anode and cathode, respectively, which can be disposed over first and second portions of submount 12. Solder mask 26 can in one aspect be disposed over a third portion of submount 12, where the third portion of submount 12 can optionally be disposed between the first and second portions of submount 12, such as between opposing first and second traces 16 and 18, respectively. In one aspect, solder mask 26 can preferably be disposed only within gap 20, such that first and second traces 16 and 18, respectively, comprise areas of exposed metal disposed directly below and/or outside portions of a lens (e.g. 32, FIG. 2). This novel solder mask placement, when combined with the exposed metal traces, and/or novel LED chip 14 configuration, (e.g., LED chip 14 mounted to cathode and wirebonded to anode), improves reflection, light emission, brightness, and overall performance of light emitter package 10. Portions of solder mask 26 can optionally be covered or layered with an optical conversion material (e.g., 46, FIG. 4B) such as at least one phosphor, lumiphor, and/or more than one phosphoric or lumiphoric material.

The size of submount 12 and/or light emitter package 10 can vary depending upon, for example, the size and/or number of LED chips 14. For illustration purposes, one LED chip 14 is shown, however, two or more LED chips 14, a plurality of LED chips 14, and/or an array of LED chips 14 is also contemplated herein. LED chip 14 can comprise any color and/or wavelength range, for example, and be configured to emit light that is red, blue, green, amber, red-orange, and/or combinations thereof. For example, where multiple LED chips 14 are used, the LED chips 14 can comprise similar and/or different targeted wavelength bins including red, blue, green, amber, red-orange, and/or combinations thereof.

LED chip 14 can comprise any suitable dimension, size, and/or shape. For example, square and/or rectangle LED chips 14 having straight cut and/or bevel cut sides are contemplated herein. In one aspect, LED chip 14 can comprise a chip having a length and/or width that is approximately 0.5 mm (e.g., 500 µm) or more, for example, LED chip 14 can comprise a length and/or width of 0.5 to 0.75 mm; approximately 0.75 to 0.85 mm; approximately 0.85 to 0.95 mm; approximately 1 to 2 mm; approximately 2 to 2.5 mm; or approximately 2.5 mm or more. In one aspect, LED chip 14 can comprise a square shaped chip having a length that is approximately equal to the width. Each of the length and width of LED chip 14 can measure approximately 0.85 mm (e.g., 850 µm, with an area of approximately 0.72 mm$^2$) or more, such as for example, approximately 0.95 mm (e.g., 950 µm, with an area of approximately 0.9 mm$^2$) or more; approximately 1 mm or more; approximately 2 mm or more, approximately 2.25 mm or more; approximately 2.35 mm or more; approximately 2.5 mm or more; and/or approximately 2.75 mm or more. Any size and/or shape of LED chips 14 is contemplated herein. In some aspects, an LED chip 14 having a chip area (e.g., length×width) of at least 6 mm$^2$ can be used, for example, a square chip having sides of approximately 2.5 mm or more.

Submount 12 can comprise a thickness between approximately 0.25 and 1.25 millimeters (mm) as measured between uppermost and bottommost surfaces of submount 12. For example, submount 12 can comprise a thickness of approximately 0.25 to 0.5 mm; approximately 0.5 mm; approximately 0.5 to 0.75 mm; and/or approximately 0.75 to 1.25 mm. Submount 12 can comprise any suitable shape, for example, such as a square, rectangle, circular, non-circular, regular, irregular, and/or asymmetrical shape. It is further understood that submount 12 and outer perimeter of package 10 can comprise any shape, as viewed from above, including square, non-square, rectangular, circular, non-circular, asymmetrical, or other multi-sided shapes. In one aspect, submount 12 can comprise a substantially square shape having a length L and a width W of approximately 2.00 mm or more. For example and without limitation, submount 12 can comprise a substantially square shape of the following length L and width W dimensions, respectively: approximately 3.0 mm×3.0 mm (e.g., an area of approximately 9 mm$^2$); approximately 3.45 mm×3.45 mm (e.g., an area of approximately 11.9 mm$^2$); approximately 4.0 mm×4.0 mm (e.g., an area of approximately 16 mm$^2$); approximately 5 mm×5 mm (e.g., an area of approximately 25 mm$^2$); approximately 6 mm×6 mm (e.g., an area of approximately 36 mm$^2$); approximately 7×7 mm (e.g., an area of approximately 49 mm$^2$); approximately 8×8 mm (e.g., an area of approximately 64 mm$^2$); approximately 9×9 mm (e.g., an area of approximately 81 mm$^2$); approximately 9.1×9.1 mm (e.g., an area of approximately 82.8 mm$^2$); and/or approximately 10 mm×10 mm (e.g., an area of approximately 100 mm$^2$); and/or length(s) L and/or width(s) W of more than approximately 10 mm×10 mm. In one aspect, a submount 12 comprising an area equal to and/or greater than approximately 45 mm$^2$ can be used.

Still referring to FIG. 1, light emitter component 10 can further comprise one or more through-holes filled with electrically conductive material, or electrically conductive vias 28. Electrically conductive vias 28 can extend internally through and/or within submount 12 between a first bottom contact (e.g., 38 FIG. 4A) and first trace 16 and between a second bottom contact (e.g., 40, FIG. 4A) and second trace 18. Light emitter package 10 can further comprise one or more alignment areas 29 or fiducials that can be used to help with registration and/or alignment of light emitter package 10 during fabrication and processing.

Notably, light emitter package 10 can exhibit improved light output, reliability, and efficacy by delivering up to and/or more than approximately 133 lumens per watt (LPW) at 350 mA and approximately 85° C. in selected color temperatures, for example, WW color temperatures around 3000K. In other aspects, light emitter package 10 can deliver up to and/or more than approximately 145 LPW at 350 mA and approximately 25° C. in selected color temperatures, such as WW color temperatures. In further aspects, packages and systems described herein can deliver up to and/or more than approximately 151 LPW at 350 mA and approximately 85° C. in selected color temperatures, such as CW color temperatures around 6000K. In further aspects, packages and systems described herein can deliver up to and/or more than approximately 165 LPW or more at 350 mA and approximately 25° C. in selected color temperatures, such as CW color temperatures. Package 10 and/or systems incorporating package 10 can advantageously deliver more LPW at a lower cost than other existing packages or systems.

Figure 2:
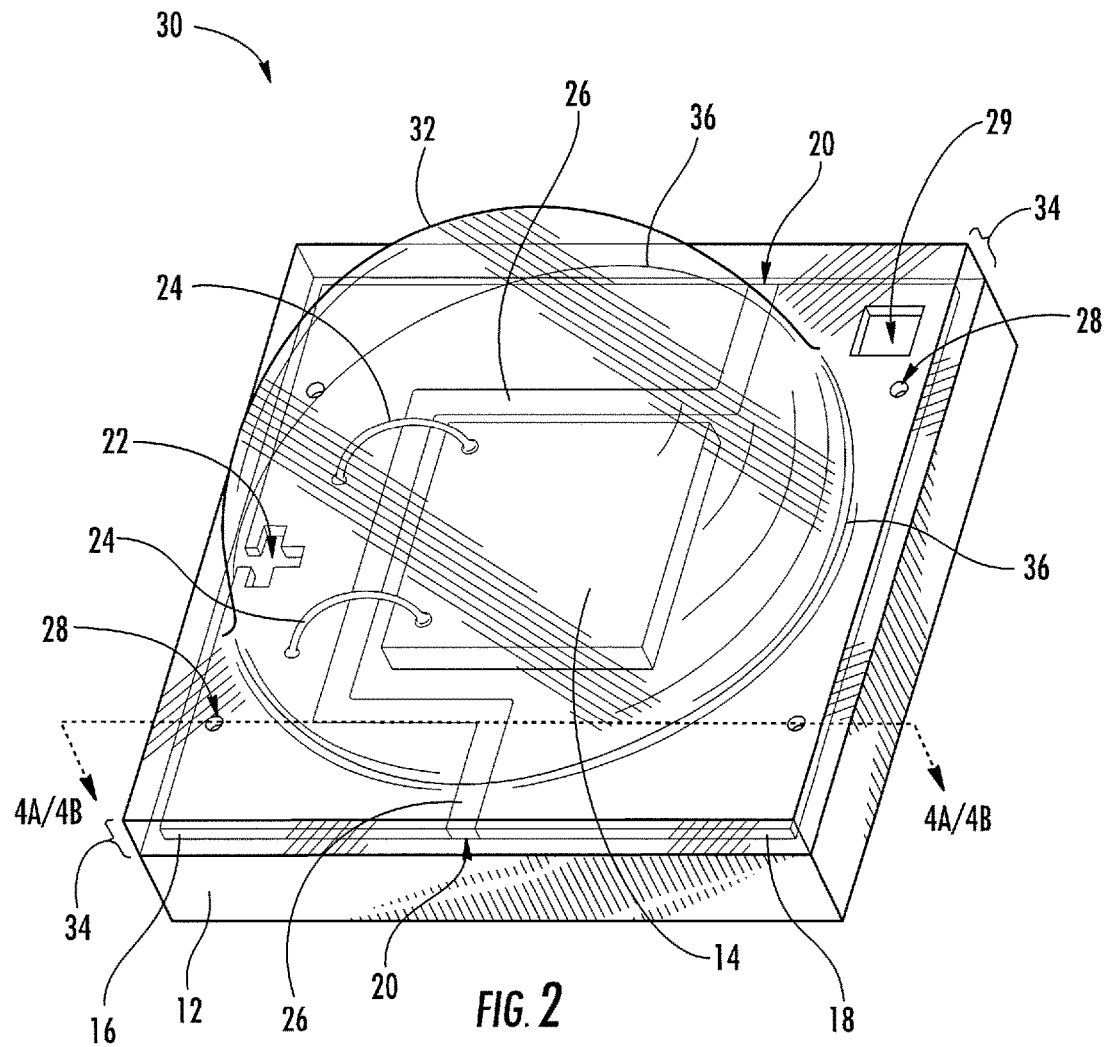
FIG. 2 is a top perspective view of a light emitter package according to one aspect of the disclosure herein.

FIG. 2 is a second embodiment of a light emitter package, generally designated 30. Light emitter package 30 is similar in form and function to package 10; however, light emitter package 30 can further comprise an optical element. An optical element can comprise any member or material configured to produce light output of a desired shape and/or position light in a desired direction, and can comprise a layer of encapsulant and/or a lens 32. A protective layer 34 can extend from portions of lens 32, for example, outwardly from portions of a lens base 36, and can be configured to extend over submount 12, and up to outermost edges of submount 12. At least a portion of lens 32 can be disposed over portions of first and second traces 16 and 18, respectively, each of which can comprise areas of exposed metal. Optical element or lens 32 can be formed on a top surface of submount 12 and can be centrally disposed or centrally aligned over a center of LED chip 14 and/or a center of submount 12, such that an apex, or area of maximum height, is aligned over the center of LED chip 14 (see e.g., FIG. 4A) and/or the center of submount 12. In other aspects, lens 32 can be non-centrally disposed (e.g., off-center) with respect to the center of LED chip 14 and/or the center of submount 12. Lens 32 can provide both environmental and/or mechanical protection of package components, such as LED chip 14, wirebonds 24, and/or exposed metal traces, such as first and second traces 16 and 18.

Lens 58 can comprise any material, such as an epoxy, plastic, glass, and/or silicone material, and can be provided using any method, such as encapsulating or molding. Lens 32 can comprise an overmolded lens, and comprise any suitable shape depending on the desired shape of the light output. One suitable shape as shown is hemispheric, where lens 32 comprises a substantially circular lens base 36. Notably, portions of first and second traces 16 and 18, respectively, which can comprise areas of exposed metal, can at least partially and/or substantially be disposed over a portion of submount 12 that is outside of lens base 36. Thus, the exposed metallic traces can advantageously reflect light by covering a large portion of submount 12 and can extend over substantial portions of submount 12 that are under or below lens 32 and lens base 36 as well as substantial portions of submount 12 that are outside of lens base 36 (e.g., towards corners, under protective layer 34). First and second traces 16 and 18 can, but do not have to extend to the outermost edges of submount 12. For example, as shown, first and second traces 16 and 18 do not extend to the outermost edges of submount 12.

A lens such as lens 32 having a non-hemispheric or circular cross-sectional and/or base shape is also contemplated herein, such as an ellipsoid bullet shaped lens, flat lens, hex-shaped lens and/or lens base, and/or square shaped lens and/or lens base. In one aspect, lens 32 can comprise a silicone material that is suitable for molding and can provide suitable optical transmission properties. It can also withstand subsequent reflow processes and does not significantly degrade over time. It is understood that lens 32 can also at least partially be textured to improve light extraction and/or be coated with or contain optical conversion, light scattering, and/or reflective materials such as phosphors or light scattering particles.

As noted above, protective layer 34 can substantially cover the top surface of submount 12 and extend between edges of lens base 36 and one or more edges of submount 12. Protective layer 34 can provide additional protection for components of light emitter package 30, such as LED chip 14, traces 16 and 18, solder mask 26 and/or wirebonds 24. Protective layer 34 can further reduce damage and/or contamination such as grease or debris during subsequent processing steps and use. For example, protective layer 34 can protect first and second traces 16 and 18 and/or optical conversion material (e.g., 46, FIG. 4B) from peeling and/or lifting during processing. Protective layer 34 can be formed during formation of lens 32 and can comprise the same or different material as lens 32. It is understood, however, that package 30 can also be provided without protective layer 34. It is understood that the lens arrangement of light emitter package 30 can easily be adapted for use with a secondary lens or optics that can be included over lens 32 by the end user to facilitate beam shaping. These secondary lenses are generally known in the art, with many of them being commercially available.

Protective layer 34 can optionally comprise one or more markings (not shown), for example, notches and/or ridges associated with the mold block and/or molding process. For example and in one aspect, optional channels can be formed or disposed in the mold block which forms lens 32 and protective layer 34. Such channels can reduce and/or prevent air bubbles from occurring in the lens encapsulant during the molding process, and can also prevent under filling. Channels can cause markings (e.g., notches or ridges, not shown) over or on portions of protective layer 34, and can further ensure that a cover film (not shown) used during the molding process sits into the lens cavity properly. Channels can advantageously create an easier path for air under the film to escape. The film cover can be used to cover the mold block to reduce or prevent silicone from settling into the mold. However, if all the air is not removed from between the film cover and mold block, an under filled lens will be observed. The channels can increase the airflow under the film and allow all the air to flow out before the film was sealed to the frame. Thus, optional channels in the mold block can advantageously prevent and/or reduce observed under filling, but may leave remnant type markings (not shown) over portions of lens 32 and/or protective layer 34.

Figure 3:
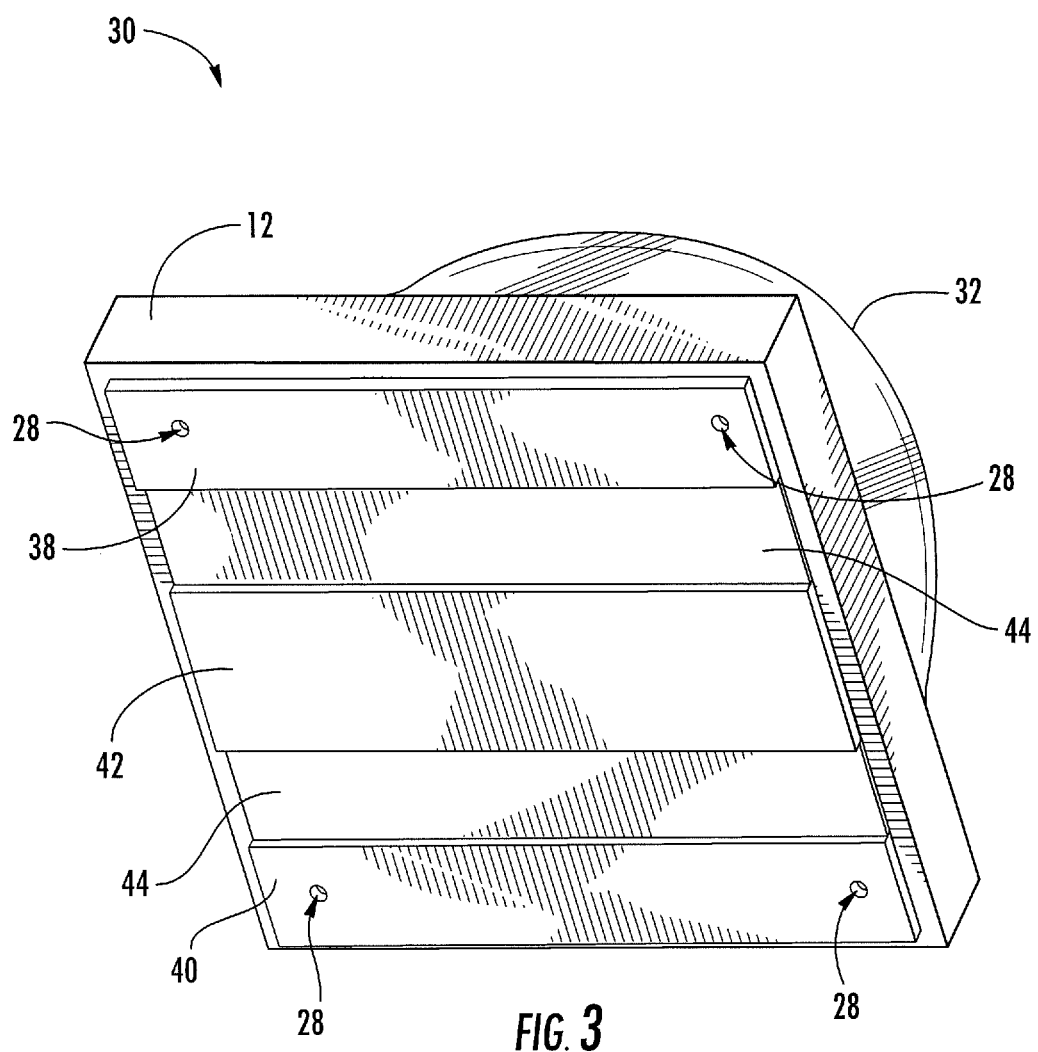
FIG. 3 is a bottom perspective view of a light emitter package according to the disclosure herein.

FIG. 3 is a bottom perspective view of light emitter package 30. Package 30 can comprise first and second electrical contacts 38 and 40 adapted to pass electrical signal or current into first and second traces 16 and 18, respectively, causing illumination of LED chip 14 (FIG. 2). First and second electrical contacts 38 and 40 can comprise metallized areas for receiving electrical signal from an external source (not shown), for example, an electrical circuit, a PCB, a metal core printed circuit board (MCPCB), a circuit of a lighting system, a flex circuit, a heat sink, combinations thereof, and/or any other source adapted to transfer electrical current. First and second electrical contacts 38 and 40 can comprise at least one layer of Cu, and optional layers of Ti and/or Ag. The at least one layer of Cu can comprise a thickness ranging from approximately 50 μm to approximately 100 μm, and/or any sub-range therebetween, such as approximately 50 to 55 μm; 55 to 65 μm; approximately 65 to 75 μm; approximately 75 to 85 μm; and/or approximately 85 to 100 μm. In one aspect, the Cu layer can comprise an overall average thickness of approximately 70 μm. Where used, the optional Ti layer of contacts 38 and 40 can be disposed between the submount 12 and Cu layer, and can comprise a thickness ranging from approximately 0.01 to 1 μm, and/or any sub-range or thickness therebetween, such as approximately 0.01 to 0.05 μm; 0.05 to 0.1 μm; and/or 0.1 to 1 μm. In one aspect, the Ti layer can comprise a thickness or overall thickness of approximately 0.1 μm. First and second contacts 38 and 40, respectively, can further comprise an optional layer of Ag that can be deposited, or otherwise formed, directly over the Cu layer such that the Cu layer is disposed between the Ti and Ag layers. Where used, the Ag layer can comprise a thickness from approximately 0.1 to 1 μm, and/or any sub-range therebetween, such as approximately 0.1 to 0.2 μm; 0.2 to 0.5 μm; 0.5 to 0.8; and/or 0.8 to 1 μm.

First and second electrical contacts 38 and 40 can be disposed on a surface of submount 12 that is opposite of placement of first and second traces 16 and 18 and/or LED chip 14. For example, first and second electrical contacts 38 and 40 can be disposed on a bottom surface of submount 12 and first and second electrical traces can be disposed on the top surface of submount 12. Electrically conductive vias 28 (FIGS. 2, 4A and 4B) can electrically connect first and second electrical contacts 38 and 40 to first and second traces 16 and 18, respectively. Electrical current can then pass between first and second contacts 38 and 40 to first and second traces 16 and 18, respectively, for illumination of LED chip 14 (FIG. 2) when electrical energy is converted into light.

A current or electrical signal can be applied through first and second electrical contacts 38 and 40 from an external source (not shown) when package 30 mounts over external source. For example, first and second electrical contacts 38 and 40 can electrically communicate to solder contacts or other conductive paths located on the external source (not shown), and pass current into first and second traces 16 and 18, respectively. An external source can comprise any suitable external source capable of conveying or passing electrical current into package 30. In the embodiment shown, light emitter package 30 can be arranged for mounting using surface mount technology and device 30 can comprises internal conductive paths defined by one or more conductive vias 28 (also shown in FIGS. 4A and 4B). First and second electrical contacts 38 and 40 can at least partially align with first and second electrical traces 16 and 18, respectfully.

Figure 4A:
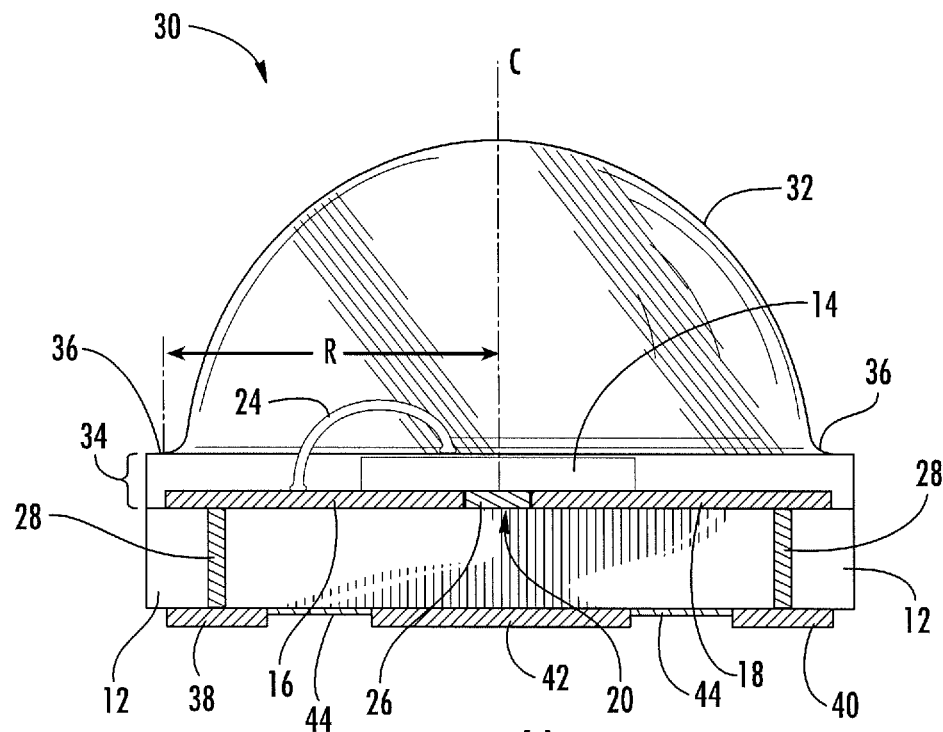
FIGS. 4A and 4B are cross-sectional views of light emitter packages according to the disclosure herein.
Figure 4B:
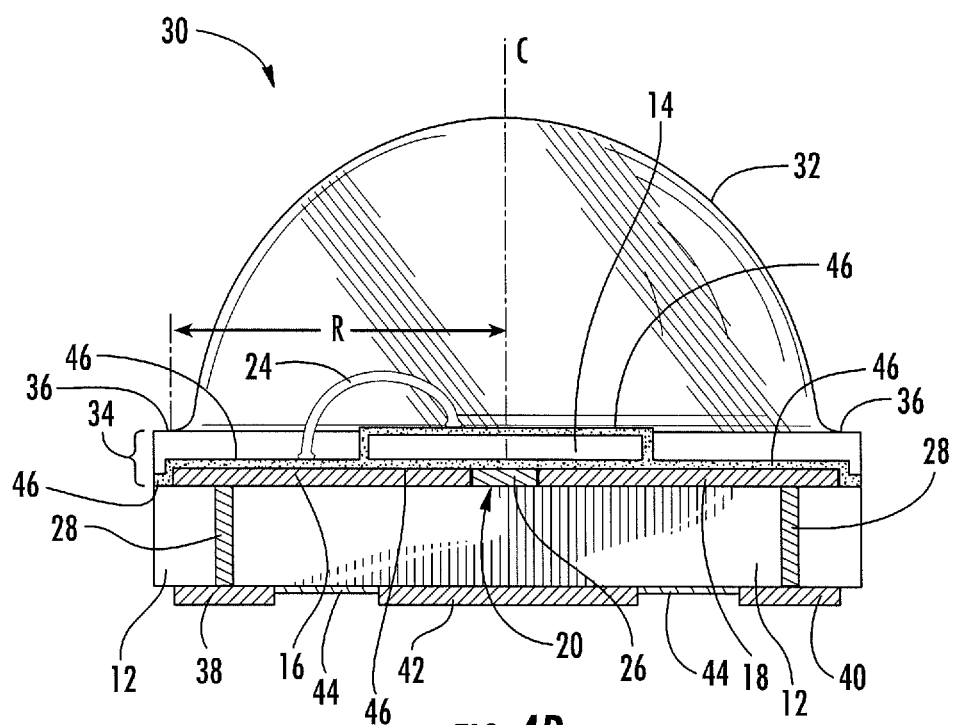

Still referring to FIG. 3, emitter package 30 can further comprise a thermal element 42 disposed over the bottom surface of submount 12. Thermal element 42 can optionally be disposed between first and second electrical contacts 38 and 40, respectively. In one aspect, thermal element 42 can be disposed in a central location of submount 12 below the one or more LED chips 14 (FIGS. 2, 4A and 4B). Thermal element 42 can comprise any thermally conductive material and can be in at least partial vertical alignment with LED chip 14 (FIGS. 2, 4A, and 4B). In one embodiment, thermal element 42 can be electrically separated from electrical traces 16 and 18 on top surface of submount 12 as well as first and second contacts 38 and 40 bottom surface of submount 12. Although heat from LED chip 14 can laterally spread over the top surface of submount 12 using first and second traces 16 and 18 (FIG. 2), more heat can pass into submount 12 directly below and around LED chip 14. Thus, thermal element 42 can assist with heat dissipation by allowing heat to spread into thermal element 42 where it can dissipate more readily from the package 30.

For packages or device used in surface mount technology, the thickness of thermal element 42 and first and second electrical contacts 38 and 40 can be approximately the same such that all three make contact to a lateral surface such as a PCB. To improve wetting of the solder however, and to ensure a more robust contact between thermal element 42 and an external heat sink, thermal element 42 may extend away from the body of the package 30 to a greater distance than first and second electrical contacts 38 and 40. That is, it is contemplated that thermal element 42 can be thicker than first and second electrical contacts 38 and 40.

Notably, areas or portions of electrically and/or thermally insulating material, such as areas of solder mask material 44, can be provided between thermal element 42 and each of first and second electrical contacts 38 and 40. In one aspect, solder mask 44 can comprise a green color, and can be approximately 1 to 25 μm thick, and any sub range thereof, such as approximately 1 to 5 μm; approximately 5 to 10 μm; approximately 10 to 13 μm; approximately 13 to 15 μm; approximately 15 to 20 μm; and/or approximately 20 to 25 μm.

FIGS. 4A and 4B are cross-sectional views of light emitter package 30, for example, as viewed along line 4A/4B-4A/4B of FIG. 2. As FIGS. 4A and 4B illustrate, one or more conductive vias 28 can extend through submount 12 between first electrical contact 38 and first electrical trace 16 for passing electrical signal therebetween. Similarly, one or more conductive vias 28 can be formed extending between second electrical contact 40 and second trace 18 such that when an electrical signal is applied to second contact 40 it can be conducted through submount 12 and into second trace 18 and into LED chip 14. Conductive vias 28 can comprise any suitably electrically conducting material, such as Ag, Cu, Au, Pt, or any other metal or metal alloy and can be applied using any suitable technique. As conductive vias 28 physically and/or electrically connect respective electrical contacts (e.g., 38 and 40) and respective traces (e.g., 16 and 18), it is understood that electrical contacts and/or traces may be positioned in other arrangements, including adjacent arrangements, in addition to the arrangement illustrated.

Conductive vias 28 can form between electrical contacts (e.g., 38 and 40) and respective traces (e.g., 16 and 18) and can be substantially vertically and/or non-vertically arranged. For example, conductive vias 28 can be arranged at an angle within submount 12. It is also understood that instead of vias 28, one or more intervening metallic or conductive layers and/or contacts can be provided between one or more surfaces of the submount 12 between electrical contacts (e.g., 38 and 40) and respective traces (e.g., 16 and 18), even, for example, along external lateral surfaces of submount 12.

As FIGS. 4A and 4B further illustrate, solder mask 26 can be at least partially disposed within gap 20 between portions of first trace 16 and second trace 18. First and second traces 16 and 18 can comprise areas of exposed metal, such as exposed Cu, Ti, Ag, and/or ENIG materials or layers as previously described. First and second traces 16 and 18 can generally occupy a large surface area of submount 12. For example first and second traces 16 and 18 can cover the substantial majority of the area between the outermost edges of submount 12. First and second traces 16 and 18 can comprise areas of exposed metal which can extend to areas of submount 12 outside of lens base 36. By extending traces in this manner, the amount of heat which can be dissipated or spread away from LED chip 14 can be improved. Thermal dissipation of heat generated in LED chip 14 can thus be improved, which improves the operating life and reliability of package 30. Improved thermal properties can also allow for a higher operating power of LED chip 14 and light emitter package 30.

Lens 32 of light emission package 30 can comprise a lens base 36 having a radius R which extends from approximately the centerline C of lens 32 to an edge defined by lens base 36, or where lens base 36 intersects with protective layer 34. In one aspect, the centerline C of lens 32 can correspond to the centerline of package 30 and/or the centerline of LED chip 14, however, centerline C of lens 32 can also be off-center with respect to either the centerline of package 30 or the centerline of LED chip 14. In further aspects, centerline C of lens 32 can be off-center with respect to centerlines of each of package 30 and LED chip 14. Lens 32 can comprise a wide viewing angle, such as approximately 120° or more, such as approximately 125°.

In one aspect, lens can 32 comprise a substantially circular shaped lens base 36 disposed over a substantially rectangular shaped submount 12 such that a diameter of lens 32 (e.g., 2×R) can be similar to length L or width W of submount 12. Lens base 36 can comprise radius R of approximately 1 to 5 mm (e.g., and an area of lens base of approximately 3.14 mm$^2$ to 78.5 mm$^2$) and/or any number or sub-range thereof. For example, lens base 36 can comprise radius R that is approximately equal to or greater than 1 mm; approximately equal to or greater than 1.53 mm; approximately equal to or greater than approximately 2.00 mm; approximately equal to or greater than approximately 2.25 mm; approximately equal to or greater than approximately 2.50 mm; approximately equal to or greater than approximately 2.75 mm; approximately equal to or greater than approximately 3.25 mm; approximately equal to or greater than approximately 3.75 mm; or approximately equal to or greater than approximately 4.25 mm. In one aspect, lens 32 can comprise an overmolded lens having a lens base 36 area of approximately 30 mm$^2$ or more, for example, approximately 33.2 mm$^2$ or more; approximately 38.5 mm$^2$ or more; approximately 44.2 mm$^2$ or more; and/or approximately 50.2 mm$^2$ or more.

Notably, the novel combination of LED electrical configuration, exposed metal traces, phosphor coated traces, solder mask placement, and/or radius R of lens base 36 can contribute to improved performance of light emitter package 30. Notably, light emitter package 30 can combine high light output, reliability and efficacy to deliver up to approximately 151 or more LPW at 350 mA and 85° C. and up to approximately 165 or more LPW at 350 mA and 25° C. in selected color temperatures, for example in CW color temperature of approximately 6000K. Light emitter package 30 can also deliver up to approximately 133 or more LPW 350 mA and 85° C. or up to approximately 145 or more LPW at 350 mA and 25° C. in selected color temperatures, for example, in WW color temperatures. Notably, package 30 can deliver approximately 200 LPW or more at 350 mm at an improved lower cost, in part by eliminating costly materials and/or processing steps associated by using exposed metal traces and a minimal amount of solder mask disposed therebetween.

As FIG. 4B illustrates, an optional layer of optical conversion material 46 can be disposed over portions of LED chip 14. Notably, optical conversion material 46 can also be directly disposed over portions of first and second traces 16 and 18, solder mask 26, and/or directly disposed over portions of submount 12. That is, optical conversion material 46 can optionally cover portions, or the entire surfaces of package 30 with the exception of the die attached surface under or below LED chip 14. Optical conversion material 46 can preferably be applied after die attachment of LED chip 14 and either prior to or after wirebonding LED chip 14. That is, in one aspect, optical conversion material can also cover portions of wirebonds 24.

This novel arrangement and placement of optical conversion material 46 directly over portions of exposed traces, solder mask 26, and/or submount 12 can increase optical performance of light emitter package 30. For example, a layer of optical conversion material 46 extending over portions of LED chip 14, traces, solder mask 26 and/or submount 12 can increase light emission from package 30, and improve package performance. Notably, advancements in LED chip 14 structure, package design, and/or phosphor placement deliver the most advanced LED components in the industry, and can allow light emitter package 30 to deliver approximately 200 LPW or more at 350 mA.

Optical conversion material 46 can comprise one or more binders, phosphors, lumiphors, or a phosphor or lumiphor containing material and binder applied via any suitable technique. In one aspect, optical conversion material 46 can absorb at least some of the light emitted from LED chip 14 and can in turn emit light having a different wavelength such that light emitter package 30 emits a combination of light from the LED chip 14 and phosphor. In one aspect, light emitter package 30 can emit light that is perceived as white light of approximately 2700 to 7000K, such as CW light around 6000K or WW light around 3000K. In one aspect, one or more LED chips 44 selected for use can comprise wavelengths targeting cool white (CW) or warm white (WW) light upon, for example, mixing with light emitted from the phosphors or a phosphor containing material. Any suitable wavelength bin and/or phosphor combination can be selected depending upon the application and desired light emission. Phosphors can be adapted to emit light that is yellow, green, red, and/or combinations thereof upon absorbing light emitted by LED chip 14.

Notably, light emitter packages shown and described herein are ENERGY STAR® qualified and ENERGY STAR® compliant. ENERGY STAR® is an international standard for energy efficient consumer products originated in the United States of America. ENERGY STAR® qualification is awarded to only certain products that meet strict efficiency, quality, and lifetime criteria. For example, ENERGY STAR® qualified LED lighting can use at least 75% less energy than incandescent lighting, save on operating expenses, reduces maintenance costs (e.g., last 35 to 50 times longer than incandescent lighting and about 2 to 5 times longer than fluorescent lighting), and reduce cooling cost. To qualify for ENERGY STAR® certification, LED lighting products must pass a variety of tests to prove that the products will display following characteristics such as having, inter alia, (i) a brightness equal to or greater than existing lighting technologies (incandescent or fluorescent), (ii) light that is well distributed over the area lighted by the fixture, (iii) light output remains constant over time, (iv)

excellent color quality with a shade of white light that appears clear and consistent over time, (v) no flicker when dimmed, and (vi) no power use when the product is turned off.

Packages shown and described herein can also be UL® recognized. That is, packages 10 and 30 as described herein can be level 4 enclosure recognized, which is the highest rating possible. Level 4 enclosure recognition indicates that light emitter packages 10 and 30 have been investigated as a fire and electrical enclosure per ANSI/UL 8750. This can advantageously save consumers time and money, therefore, advantageously promote the adoption of LED products.

Figure 5:
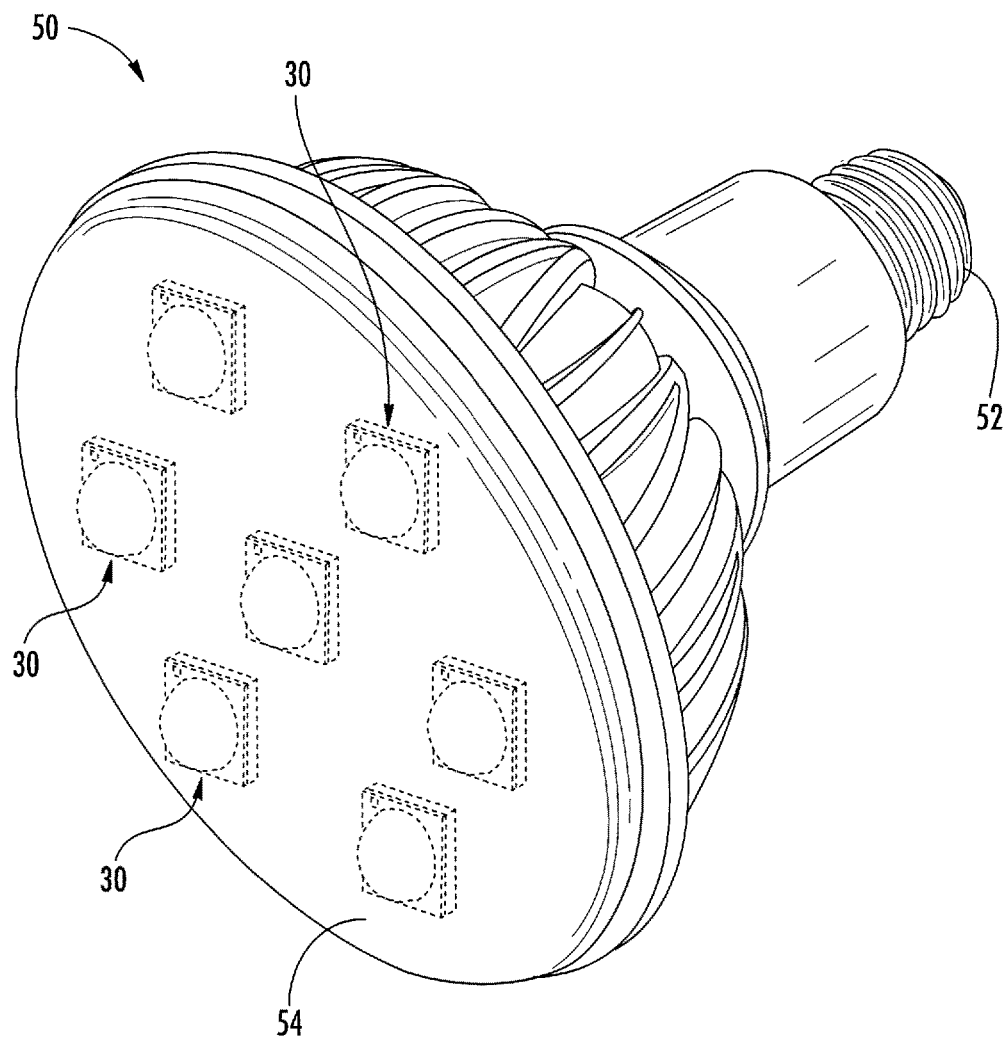
FIG. 5 is a light emitter system or component incorporating one or more light emitter packages according to the disclosure herein.

FIG. 5 is a light emitter system, generally designated 50, which can incorporate one or more light emitter packages 30 according to the disclosure herein. Light emitter system 50 can comprise any lamp or bulb used in directional, low and high bay, roadway and parking, high end lighting, indoor lighting, outdoor lighting, portable lighting, and/or off-grid lighting. In one aspect, system 50 comprises a parabolic aluminized reflector (PAR) lamp. System 50 can comprise a base 52 adapted to plug into a socket or circuit for receiving electrical energy used for light conversion. System 50 can further include a light emitter portion 54 from which light can be emitted by one or more light emitter packages 30. Packages 30 are indicated in phantom lines as they may be placed within or below a portion of a lens, bulb, or other optical component of system 50, and may not be visible externally. System 50 can be configured to incorporate one, or more than one light emitter packages 30. For example, in one aspect, system 50 can comprise seven light emitter packages 30, however, any number of packages can be used in light emitter system 50.

Notably, light emitter packages 30 can be used to upgrade an existing system 50, such that, for example, system 50 can be upgraded from a 60 W or 75 W equivalent lamp to a 90 W or 100 W equivalent lamp in one step. Light emitter packages 30 can advantageously be designed to conform to existing system 50 dimensions, while being brighter and more efficient at a lower cost such that the improved packages can replace emitters within existing systems without requiring a redesign of system 50. Consumers can easily incorporate packages 30 into lighting systems, such as system 50 for an immediate boost in performance at a lower cost and/or lower power consumption. In one aspect, light emitter package 30 can be configured to drop-in to system 50 allowing for an easy upgrade to different, brighter, and/or more efficient emitter in one simple step. Packages 30 and systems described herein can be available over and/or be configured to deliver a range of color temperatures from WW to CW, for example, from approximately 2700 to 7000K. Packages 30 and systems described herein can also be available in various CRI options, for example, a minimum of 80 CRI in selected color temperatures.

Figure 6A:
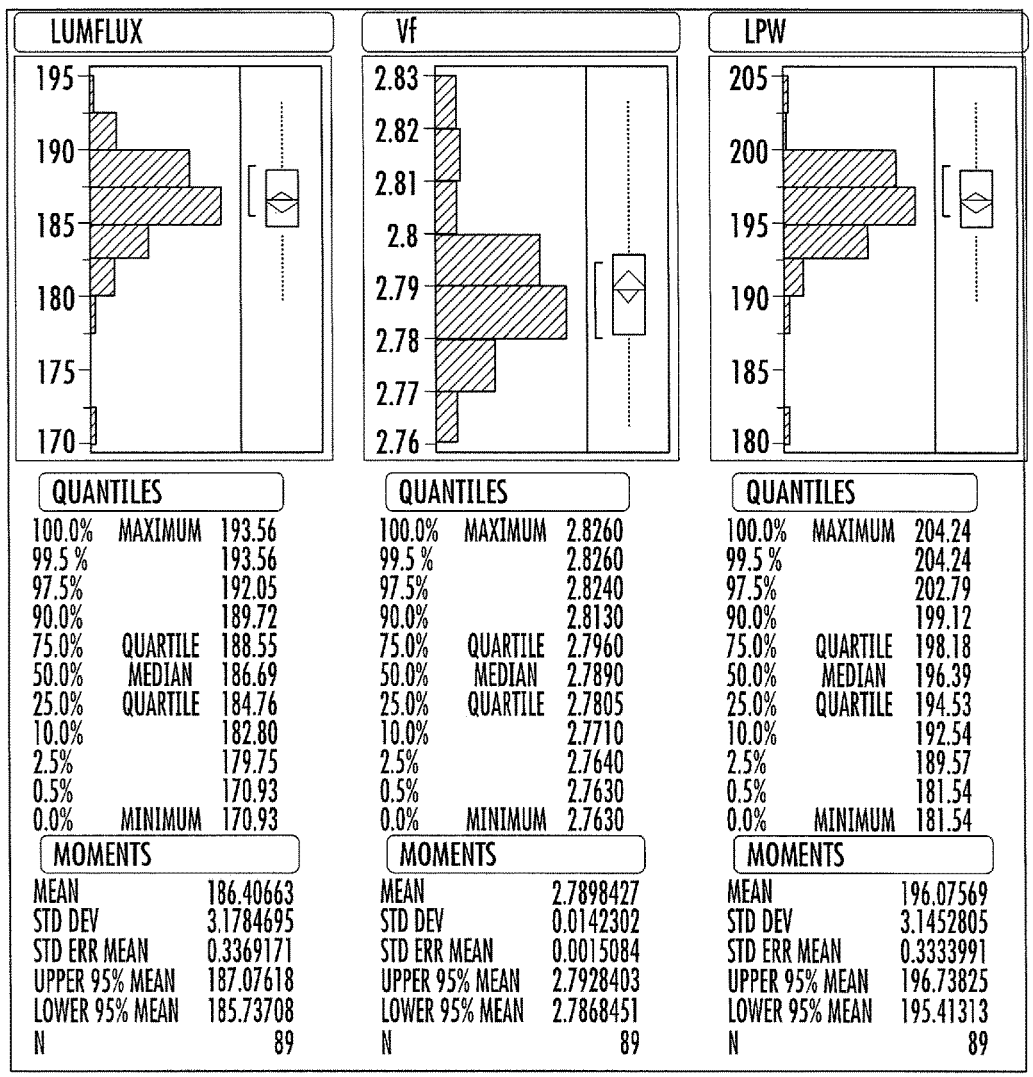
FIGS. 6A to 8B are graphical illustrations of brightness and/or color temperature data associated with light emitter packages and systems according to the disclosure herein.
Figure 6B:
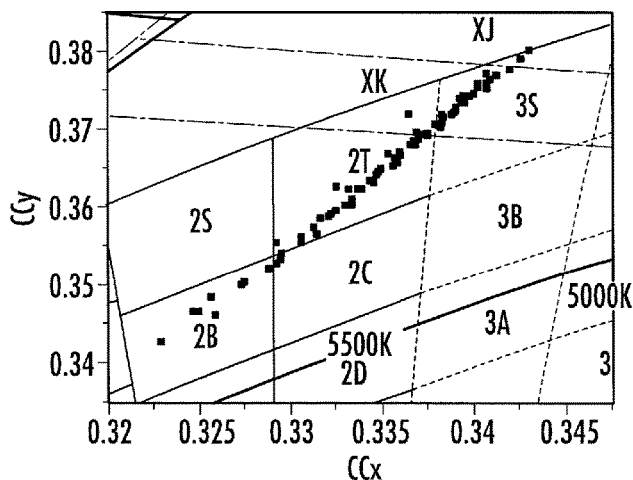

FIGS. 6A to 8B are graphical illustrations of brightness and/or color data associated with light emitter packages and/or systems disclosed herein. FIG. 6A shows distribution graphs or plots for 89 parts, (e.g., packages and/or systems disclosed herein) and FIG. 6B shows the parts plotted as a function of chromaticity (CCx, CCy) bin. With respect to FIG. 6A, the graph on the left is a distribution of luminous flux measurements, the graph in the middle is a distribution of forward voltage (e.g., Vf) measurements, and the graph on the right is a distribution of LPW measurements. As the graphs illustrate, the parts averaged approximately 186.4 lumens (lm) and 2.79 volts (V). Notably, as the graph on the right illustrates, the parts averaged approximately 196.08 LPW at 350 mA, and a total of 6 parts were above 199.5 LPW. At least 2.5% of the parts (e.g., in the 97.5 percentile) measured above 200 LPW, and delivered approximately 200 LPW or more at 350 mA using a single LED chip. FIG. 6B illustrates the parts falling into the CW and/or neutral white chromaticity bins.

Figure 7:
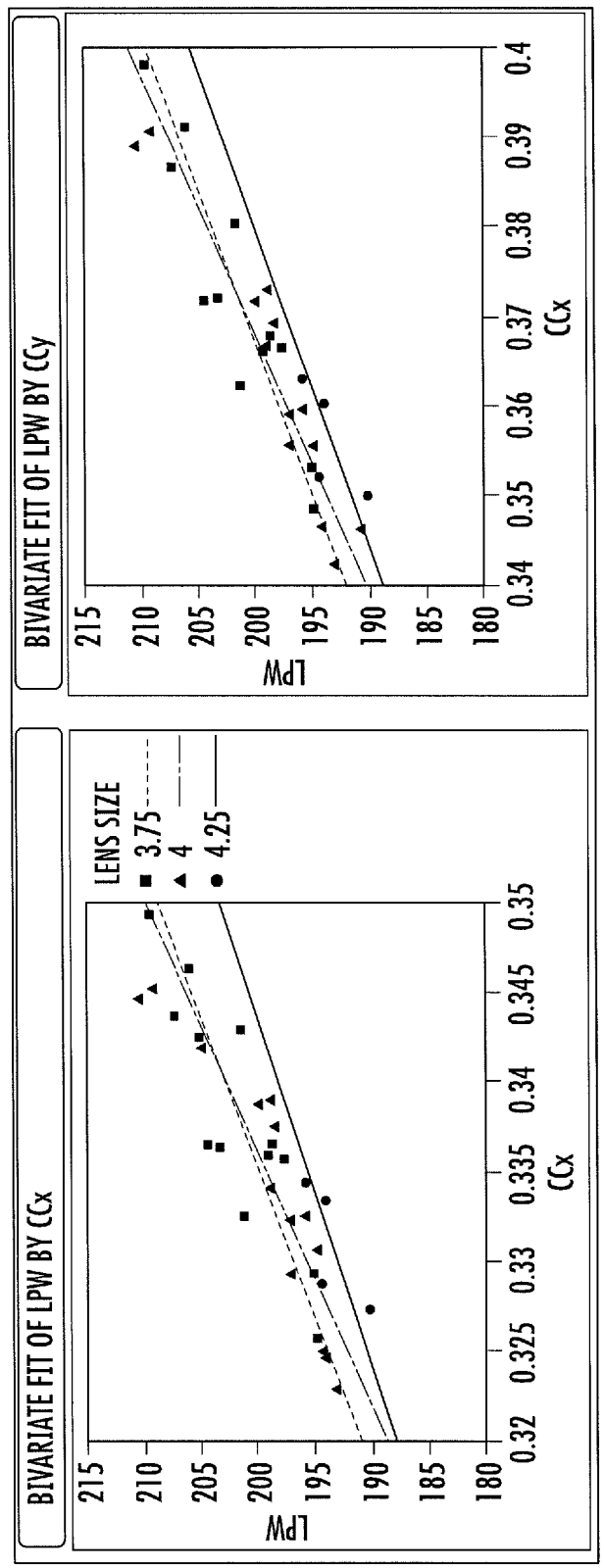

FIG. 7 illustrates LPW data as a function of chromaticity for parts having different lens radii. For example, FIG. 7 includes LPW data plotted at the CW border. As the graphs illustrate, parts having lens radii of approximately 3.75 mm and 4.0 mm perform similarly and can average approximately 203.4 LPW at the CW border. Parts having a lens radius of approximately 4.25 mm can be slightly dimmer and can average approximately 199.15 LPW at the CW border.

Figure 8A:
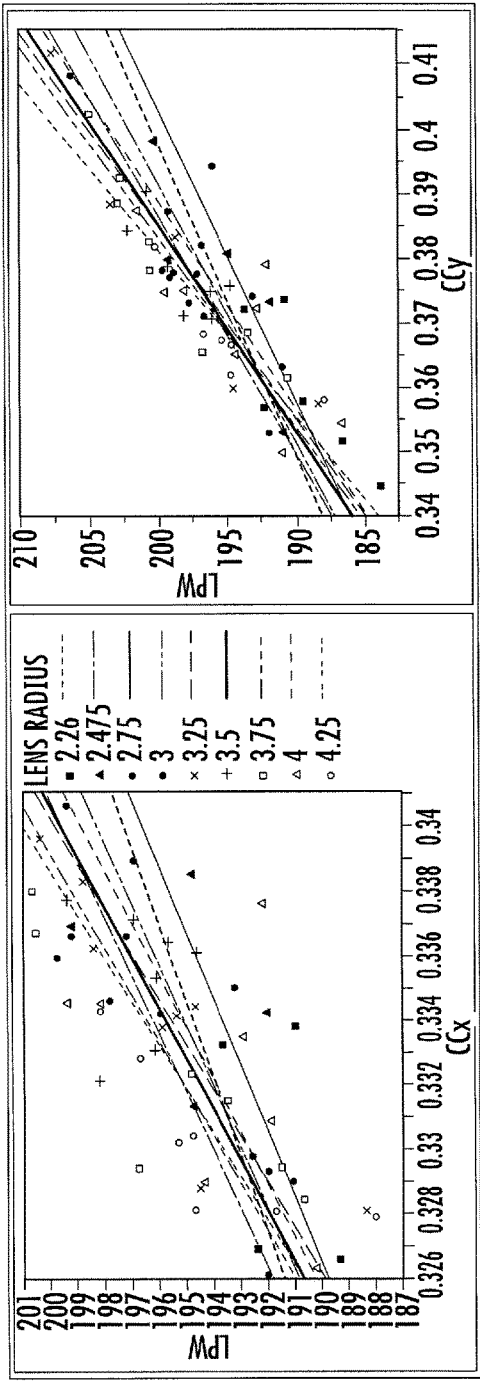
Figure 8B:
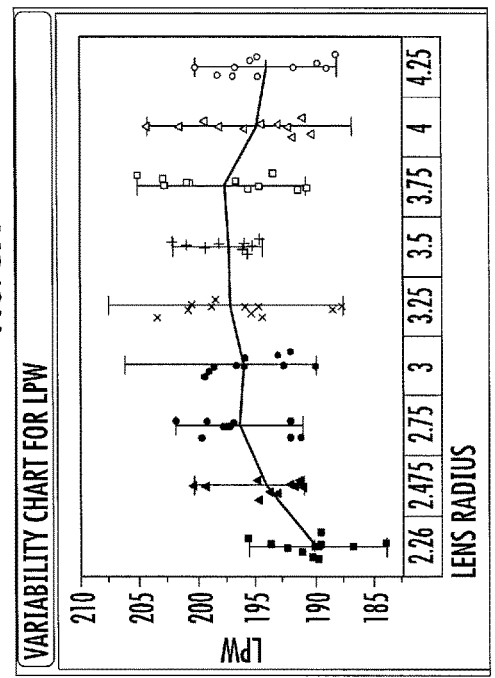

FIGS. 8A and 8B are further comparisons of LPW measurements for parts having differently sized lens radii. FIG. 8A illustrates LPW measurements at the CW border for differently sized radii, and FIG. 8B illustrates LPW variability per lens radii. As FIG. 8A illustrates, parts having a lens radius of approximately 2.26 mm were the dimmest and averaged approximately 193.6 LPW (and 350 mA) at the CW border. Parts having a lens radius of approximately 4.25 mm were the brightest and averaged approximately 196.9 LPW (and 350 mA) at the CW border. Parts having a lens radius between approximately 2.75 and 3.75 behave similarly, and averaged between approximately 195.4 and 196.5 LPW (and 350 mA) at the CW border.

As FIG. 8B illustrates, parts that have the same lens radius can vary in brightness, for example, around 10 LPW or more per group, on average. Overall, parts having a lens radius between approximately 2.26 and 4.25 mm can vary in brightness from, for example, less than approximately 185 LPW to more than approximately 205 LPW at 350 mA and 25° C. Each group having a lens radius greater than approximately 2.26 mm had at least one part that measured equal to and/or greater than approximately 200 LPW at 350 mA. A maximum average LPW can occur, for example, in parts having a lens radius between approximately 3.25 and 3.75 mm. Parts having a lens radius of approximately 2.75 to 3.75 had a similar average LPW, for example, around 196 LPW at 350 mA.

As stated above, novel LED chips, exposed metal traces, solder mask placement, lens size, chip size, and/or phosphor placement can be used alone and/or in combination to provide packages and systems having improved optical performance at a lower cost. Embodiments of the present disclosure shown in the drawings and described above are exemplary of numerous embodiments that can be made within the scope of the appended claims. It is contemplated that the configurations of light emitter packages, systems, and methods with improved brightness and efficiency can comprise numerous configurations other than those specifically disclosed herein.

What is claimed is:

1. A light emitter package comprising:
   a submount comprising a plurality of outer edges and a planar surface disposed between the outer edges;
   multiple areas of exposed metal disposed over the planar surface of the submount, wherein the areas of exposed metal extend adjacent to the outer edges of the submount, but not beyond the outer edges of the submount;
   a light emitter chip disposed over the submount;
   a lens disposed over the submount, the lens comprising a lens base; and
   a protective layer disposed around the lens base;
   wherein the areas of exposed metal are disposed over substantially all of a portion of the submount that is outside of the lens base, below the protective layer, and around each side of the light emitter chip outside of the lens base for reflecting light therefrom, wherein the protective layer contacts all of the areas of exposed metal that are around each side of the light emitter chip and outside the lens base, wherein the areas of exposed metal are separated by a gap that is continuous between opposing side edges of the substrate, wherein the gap is filled, at least partially, by solder mask material that is not disposed over the areas of exposed metal, and wherein all of the areas of exposed metal are devoid of solder mask material so that the areas of exposed metal are reflective.

2. The light emitter package of claim 1, wherein the light emitter package is configured to deliver approximately 200 or more lumens per watt (LPW) at 350 mA.

3. The light emitter package of claim 1, wherein the multiple areas of exposed metal comprise an anode and a cathode.

4. The light emitter package of claim 3, wherein the solder mask material is at least partially disposed between the anode and the cathode.

5. The light emitter package of claim 3, wherein the light emitter chip is entirely disposed over the cathode.

6. The light emitter package of claim 1, wherein a discrete layer of optical conversion material is disposed directly over portions of the light emitter chip.

7. The light emitter package of claim 1, wherein the multiple areas of exposed metal comprise copper (Cu).

8. The light emitter package of claim 7, wherein the multiple areas of exposed metal comprise copper (Cu), silver (Ag), and Titanium (Ti).

9. The light emitter package of claim 1, wherein the lens base comprises a circular lens base.

10. The light emitter package of claim 1, wherein the lens base comprises a radius equal to or greater than approximately 1.53 mm.

11. The light emitter package of claim 1, wherein the lens base comprises a radius equal to or greater than approximately 2.25 mm.

12. The light emitter package of claim 1, wherein the lens base comprises a radius equal to or greater than approximately 3.75 mm.

13. The light emitter package of claim 1, wherein the submount comprises a length and width of approximately 3.45 mm.

14. The light emitter package of claim 1, wherein the submount comprises a length and width of approximately 7 mm.

15. The light emitter package of claim 1, wherein the submount comprises a length and width of approximately 9.1 mm.

16. The light emitter package of claim 1, wherein the light emitter chip comprises a surface area of at least 6 $mm^2$.

17. The light emitter package of claim 1, wherein the submount comprises a surface area of approximately 45 $mm^2$ or more.

18. The light emitter package of claim 9, wherein the lens base comprises an area of approximately 30 $mm^2$ or more.

19. The light emitter package of claim 1, wherein the submount comprises a thermal conductivity equal to or greater than approximately 30 watts per meter kelvin (W/m·K).

20. The light emitter package of claim 9, wherein the circular lens base is disposed over the submount, wherein the submount comprises a rectangular shape, and wherein a length of the submount is equal to or greater than a diameter of the circular lens base.

21. The light emitter package of claim 1, wherein the light emitter package is ENERGY STAR® compliant.

22. The light emitter package of claim 1, wherein the light emitter package is level 4 UL® recognized.

23. A light emitter package comprising:
a submount comprising a planar surface;
a plurality of electrical components disposed over the planar surface of the submount, wherein the plurality of electrical components comprises at least a first electrical trace, a second electrical trace, and a light emitter chip, and wherein a gap is disposed between the first electrical trace and the second electrical trace;
a solder mask material disposed only in the gap;
a protective layer of silicone disposed over the submount; and
at least one discrete and continuous layer of phosphor that is disposed between the protective layer of silicone and the planar surface of the submount, wherein the layer of phosphor is disposed over multiple surfaces of each electrical component of the plurality of electrical components, and wherein surfaces of each electrical component that are facing the planar surface of the submount are devoid of the at least one layer of phosphor.

24. The light emitter package of claim 23, wherein the light emitter package is configured to deliver approximately 200 or more lumens per watt (LPW) at 350 mA.

25. The light emitter package of claim 23, wherein one or more of the at least one layer of phosphor is configured to emit blue, green, or red light.

26. The light emitter package of claim 23, wherein the solder mask material is white.

27. The light emitter package of claim 23, further comprising a lens formed over the protective layer.

28. The light emitter package of claim 27, wherein the lens comprises a circular lens base.

29. The light emitter package of claim 28, wherein the circular lens base is disposed over the submount, wherein the submount comprises a rectangular shape, and wherein a length of the submount is equal to or greater than a diameter of the circular lens base.

30. The light emitter package of claim 23, wherein the light emitter chip comprises a surface area of at least 6 $mm^2$.

31. The light emitter package of claim 23, wherein the submount comprises a surface area of approximately 45 $mm^2$ or more.

32. The light emitter package of claim 28, wherein the lens base comprises an area of approximately 30 $mm^2$ or more.

33. The light emitter package of claim 23, wherein the submount comprises a thermal conductivity equal to or greater than approximately 30 watts per meter kelvin (W/m·K).

34. The light emitter package of claim 23, wherein the first and second traces comprise silver.

35. The light emitter package of claim 23, wherein the first and second traces comprise copper.

36. The light emitter package of claim 23, wherein the light emitter package is ENERGY STAR® compliant.

37. The light emitter package of claim 23, wherein the light emitter chip is entirely disposed over either the first electrical trace or the second electrical trace.

\* \* \* \* \*